(12) United States Patent
Nishida et al.

(10) Patent No.: US 6,917,567 B2
(45) Date of Patent: Jul. 12, 2005

(54) COIL DRIVING SYSTEM, INFORMATION STORAGE APPARATUS, AND DRIVING METHOD

(75) Inventors: Masatsugu Nishida, Kawasaki (JP); Shigenori Yanagi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 247 days.

(21) Appl. No.: 09/960,094

(22) Filed: Sep. 21, 2001

(65) Prior Publication Data

US 2002/0191498 A1 Dec. 19, 2002

(30) Foreign Application Priority Data

Jun. 15, 2001 (JP) ......................................... 2001-181918

(51) Int. Cl.[7] ............................................. G11B 11/00
(52) U.S. Cl. ............................................. 369/13.22
(58) Field of Search ..................... 369/13.22; 360/66; 327/110

(56) References Cited

U.S. PATENT DOCUMENTS

| | | | | | |
|---|---|---|---|---|---|
| 4,825,333 | A | * | 4/1989 | Clive et al. ................. | 361/154 |
| 5,721,714 | A | * | 2/1998 | Lewis ..................... | 369/13.22 |
| 5,724,319 | A | * | 3/1998 | Fuji et al. ................ | 369/13.22 |
| 5,748,573 | A | * | 5/1998 | Ohmori ................... | 369/13.22 |
| 5,801,504 | A | | 9/1998 | Endo et al. ................ | 318/434 |
| 5,991,242 | A | * | 11/1999 | Ishii ........................ | 369/13.22 |
| 6,040,674 | A | * | 3/2000 | Nishida et al. ............. | 318/632 |
| 6,252,440 | B1 | * | 6/2001 | Sushihara et al. .......... | 327/110 |
| 6,570,413 | B1 | * | 5/2003 | Kumagai et al. ........... | 327/108 |

FOREIGN PATENT DOCUMENTS

| | | |
|---|---|---|
| DE | 196 39 178 | 3/1997 |
| DE | 196 39178 C2 | 3/1997 |
| JP | 03-046144 | 2/1991 |
| JP | 05-030772 | 2/1993 |
| JP | 05-120606 | 5/1993 |
| JP | 09-044924 | 2/1997 |
| JP | 11-025539 | 1/1999 |
| JP | 2000-245192 | 9/2000 |

* cited by examiner

Primary Examiner—Aristotelis M Psitos
(74) Attorney, Agent, or Firm—Greer, Burns & Crain, Ltd.

(57) ABSTRACT

A predetermined electric current is supplied to coil by changing a pulse width of a voltage applied to the coil according to a current instruction value. An electric current which flows through the coil is detected; the thus-detected current value is compared with the current instruction value; the voltage applied to the inductance device is turned on/off according to the comparison result; and an off time for which application of the voltage to the coil is interrupted is controlled according to the current instruction value.

20 Claims, 16 Drawing Sheets

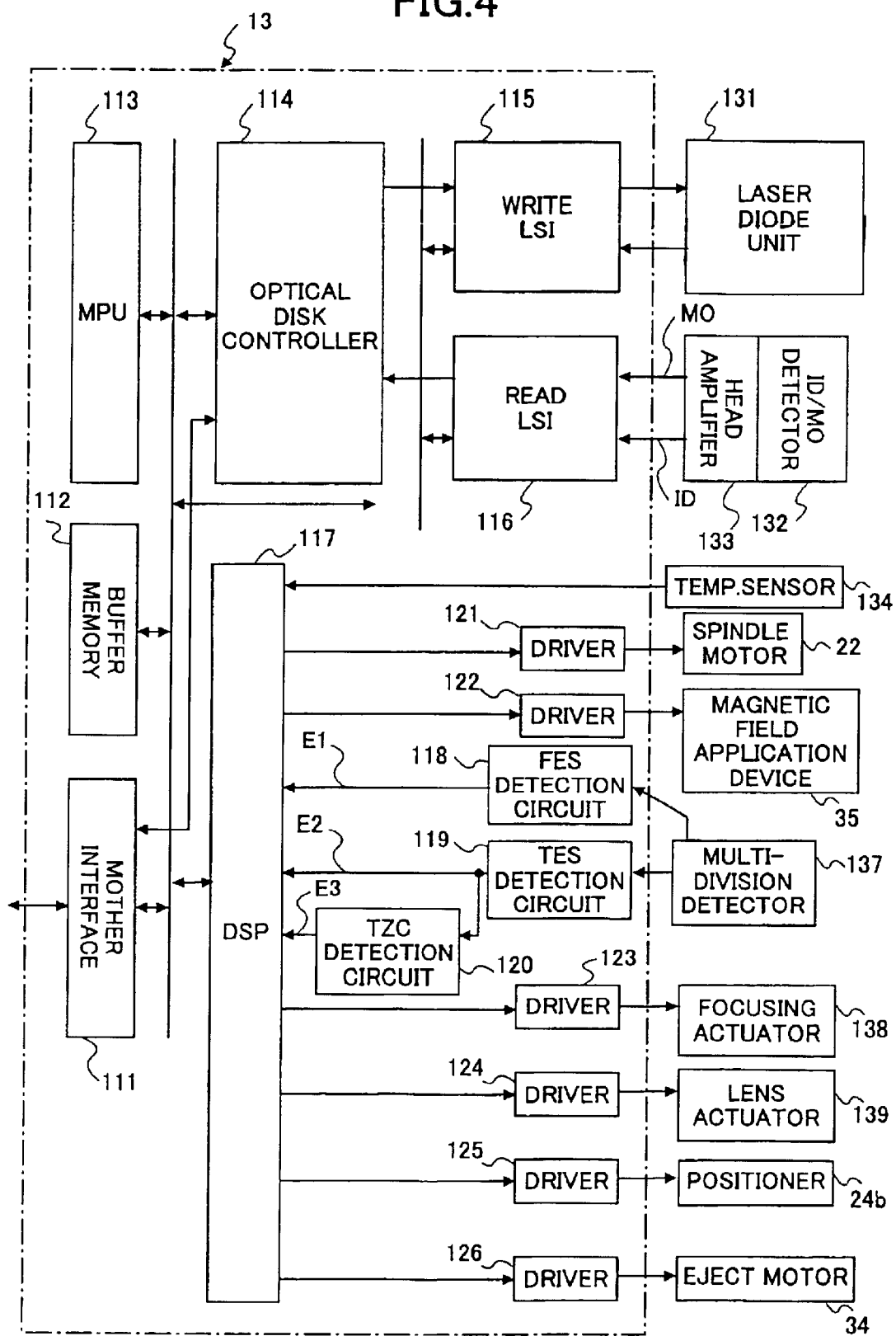

FIG.7

| BMGF | BMGR | P OUTPUT | N OUTPUT | NOTE |
|---|---|---|---|---|
| H | L | H | L | POSITIVE CHANGE(P→N) |
| L | H | L | H | NEGATIVE CHANGE(N→P) |
| L | L | L | L | SHORT BREAK |

FIG.10A

| ZONE NUMBER | ELECTROMAGNET ELECTRIC CURRENT | | | |
|---|---|---|---|---|
| | ERASE | RECORD | INITIAL VALUE FOR REPRODUCTION | CALIBRATION COEFFICIENT |
| Z1 | $I_E[mA]$ (DAC$_E$) | $I_W[mA]$ (DAC$_W$) | $I_{R\_Z1}[mA]$(DAC$_{R\_Z1}$) | $\alpha 1$ |
| Z2 | | | $I_{R\_Z2}[mA]$(DAC$_{R\_Z2}$) | $\alpha 2$ |
| Z3 | | | $I_{R\_Z3}[mA]$(DAC$_{R\_Z3}$) | $\alpha 3$ |
| Z4 | | | $I_{R\_Z4}[mA]$(DAC$_{R\_Z4}$) | $\alpha 4$ |
| Z5 | | | $I_{R\_Z5}[mA]$(DAC$_{R\_Z5}$) | $\alpha 5$ |
| Z6 | | | $I_{R\_Z6}[mA]$(DAC$_{R\_Z6}$) | $\alpha 6$ |
| Z7 | | | $I_{R\_Z7}[mA]$(DAC$_{R\_Z7}$) | $\alpha 7$ |
| Z8 | | | $I_{R\_Z8}[mA]$(DAC$_{R\_Z8}$) | $\alpha 8$ |
| Z9 | | | $I_{R\_Z9}[mA]$(DAC$_{R\_Z9}$) | $\alpha 9$ |
| Z10 | | | $I_{R\_Z10}[mA]$(DAC$_{R\_Z10}$) | $\alpha 10$ |
| Z11 | | | $I_{R\_Z11}[mA]$(DAC$_{R\_Z11}$) | $\alpha 11$ |

FIG.10B

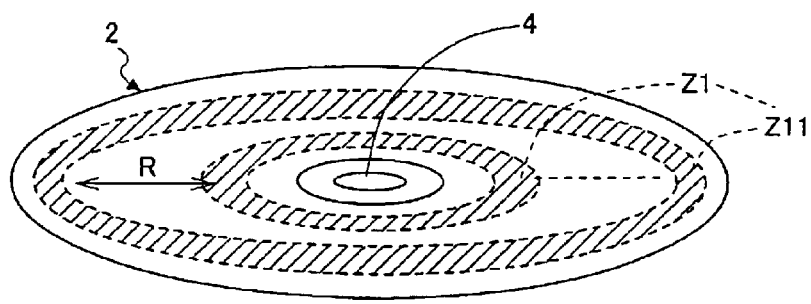

| BLAS_DAC | BMPWMCNT |
|---|---|
| 0x00~0x0f | 0x18 |
| 0x10~0x1f | 0x10 |
| 0x20~0x3f | 0x08 |
| 0x40~0x7f | 0x04 |
| 0x80~0xff | 0x01 |

COIL DRIVING SYSTEM, INFORMATION STORAGE APPARATUS, AND DRIVING METHOD

BACKGROUND OF THE INVENTION

1. Field of the Invention

The present invention relates to a coil driving system, an information storage apparatus, and a coil driving method, and, in particular, the present invention relates to a coil driving system, an information storage apparatus, and a coil driving method for supplying a pulse-shaped electric current according to a current instruction value to a coil especially so as to drive the a coil of the information storage apparatus.

In recent years, increase in storage capacity of an information storage apparatus is desired according to increase in amount of information processed by a computer. Moreover, as an information storage apparatus, a magneto-optical disk device in which recording/reproduction of information on an magneto-optical disk attracts attention.

For a magneto-optical disk device, further improvement in recording density is achieved by using super-resolution (MSR: magnetically induced super resolution) technology.

FIGS. 1A and 1B illustrate the super-resolution technology. FIG. 1A shows a magnified view of a track portion of a magneto-optical disk, and FIG. 1B shows a sectional view of the magneto-optical disk.

A magneto-optical disk 2 used in the super-resolution technology has a recording layer, a middle layer L2, and a readout layer L3. The super-resolution technology is a technology which improves recording density by masking (Msf and Msr zones, shown in FIG. 1B) magnetically pits Pf and Pr contiguous to a pit P0 from which reading is made, by a temperature distribution made by a laser spot Ls. To the mask zone Msf, the laser spot Ls has not been applied yet, and, since the temperature thereof is thus low, the middle class L2 is magnetized along a predetermined direction by a reproduction magnetic field, and thereby information cannot be read therefrom as the information on the record layer Li is thus not reflected by the readout layer L3. Moreover, to the mask zone Msr, it is a zone through which the laser spot Ls has already passed, and since the temperature is thus high, the readout layer L3 is magnetized by the reproduction magnetic field, and thereby the information cannot be read as the information in the record layer LI is thus not reflected by the read-out layer L3. Thus, the middle layer L2 and the readout layer L3 are influenced by the reproduction magnetic field according to the temperature distribution before and after the laser spot Ls passes therethrough, thus, the portion which can be read is limited, and thereby high-density recording is attained. However, in the super-resolution technology, the strength of the external magnetic field used at a time of reproduction is needed to be set up appropriately with high accuracy so that the level of the reproduced signal should be prevented from lowering, and, thus, a problematic situation such that reproduction cannot be performed properly should be prevented from occurring.

2. Description of the Related Art

FIG. 2 shows an exploded perspective view of a magneto-optical disk device in the related art. A magneto-optical disk cartridge 3 in which a magneto-optical disk 2 is contained is loaded in the magneto-optical disk device 1 which records/erases/reproduces information on/from the magneto-optical disk 2. The magneto-optical disk device 1 includes a base assembly 11, a load assembly 12, and a circuit board 13.

FIGS. 3A, 3B and 3C show a configuration of the base assembly 11. FIG. 3A shows a plan view of the base assembly 11, FIG. 3B shows a perspective view near a carriage, and FIG. 3C shows a sectional view near the carriage.

The base assembly 11 includes a mechanical base 21 having a spindle motor 22, a fixed optical system 23, the carriage 24, and a head circuit board 25, loaded thereon.

At a time the magneto-optical disk 2 contained in the magneto-optical disk cartridge 3 is loaded at a predetermined load position, the spindle motor 22 engages with a central hole 4 of the magneto-optical disk 2, and rotates the magneto-optical disk 2. The fixed optical system 23 including a laser diode outputs a laser beam according to a drive signal supplied from the head circuit board 25. The laser beam outputted from the fixed optical system 23 is applied to the carriage 24.

In the carriage 24, the laser beam from the fixed optical system 23 along a B1 direction, is bent to a A1 direction toward the magneto-optical disk 2, and thereby, the magneto-optical disk 2 is irradiated. At this time, in the carriage 24, an object lens 24a is swung so that the laser beam LB is focused onto the magneto-optical disk 2, and thus, focal control is performed. Moreover, in the carriage 24, the object lens 24a is swung so that the laser beam LB scans a predetermined track formed on the magneto-optical disk 2, and thus tracking control is performed. Furthermore, a positioner 24b is provided in the carriage 24, and the carriage 24 is moved along a radius direction B of the magneto-optical disk 2 by the positioner 24b.

The laser beam LB applied onto the magneto-optical disk 2 from the carriage 24 is reflected by the magneto-optical disk 2, and returns to the carriage 24. The carriage 24 supplies the laser beam LB reflected by the magneto-optical disk 2 to the fixed optical system 23.

The fixed optical system 23 detects an MO signal, a focus error signal, and a tracking error signal based on the laser beam LB supplied thereto by the carriage 24. The laser beam LB is supplied to a detector for signal detection provided in the fixed optical system 23, and is changed into an electric signal. Moreover, the laser beam LB is supplied to a detector for focal error detection provided in the fixed optical system 23, and is changed into an electric signal. Furthermore, the laser beam LB is supplied to a tracking error detection detector provided in the fixed optical system 23, and is changed into an electric signal. The signals obtained from the detector for signal detection, the detector for focus error detection, and the detector for tracking error detection are supplied to the head circuit board 25. The head circuit board 25 amplifies these signals, and supplies them to the circuit board 13.

The base assembly 11 includes a loading/ejection assembly 12. The loading/ejection assembly 12 loads the magneto-optical disk cartridge 3 containing the magneto-optical disk 2 into the predetermined load position, or ejects the same from the load position. It includes a load base 31 with a load mechanism 32, a cartridge holder 33, and an ejection motor 34 loaded thereon.

On the load base 31, the cartridge holder 33 is held movably through the load ejection mechanism 32. Into the cartridge holder 33, the magneto-optical disk cartridge is loaded. A cartridge maintenance mechanism, a shutter opening/closing mechanism, and a bias magnetic field application device 25 are provided in the cartridge holder 33. The cartridge maintenance mechanism is a mechanism which guides the magneto-optical disk cartridge 3 in case the magneto-optical disk cartridge 3 is loaded/ejected, and thus maintains the posture thereof. The shutter opening/closing mechanism is a mechanism which opens a shutter 5 provided in the magneto-optical disk cartridge 3 at the time of loading, or closes the shutter 5 at the time of ejection.

The bias magnetic field application device 35 includes a coil 35a and a yoke 35b, as shown in FIG. 3B. By supplying an electric current to the coil 35a, a bias magnetic field (corresponding to the above-mentioned external magnetic field used in the super-resolution technology described above) generated by the coil 35a passes through the yoke 35b, and is thus applied to the magneto-optical disk 2.

The loading/ejection mechanism 32 is driven by the ejection motor 34, and ejects the magneto-optical disk cartridge 3. It connects with the circuit board 13 and the ejection motor 34 is driven based on the drive signal provided from the circuit board 13. Moreover, the circuit board 13 detects operation of an ejection button by a user, and supplies the drive signal to the ejection motor 34.

Moreover, the magnetic field application device 35 is loaded at a position corresponding to a window in the top surface of the magneto-optical disk cartridge 3 exposed when the shutter 5 is opened. The magnetic field application device 35 is disposed at a position such as to face the carriage 24 through the magneto-optical disk 2 when the magneto-optical disk cartridge 3 is loaded. The magnetic field application device 35 applies the bias magnetic field to the magneto-optical disk 2 at the time of recording/erasing/reproducing of information to/from the magneto-optical disk 2.

FIG. 4 shows a block diagram of the above-described magneto-optical disk device.

An interface 111, a buffer memory 112, an MPU 113, an optical disk controller (ODC) 114, a write LSI 115, a read LSI 116, a DSP 117, a focus error signal detection circuit 118, a tracking error signal detection circuit 119, a track zero crossing detection circuit 120, and a driver circuits 121 through 126 are mounted on the control circuit board 13. With the control circuit board 13, a laser diode unit 131, a head amplifier 133, a temperature sensor 134, the spindle motor 22, the magnetic field application device 35, a multi-division detector 137, a focusing actuator 138, a lens actuator 139, the positioner 24b, and the ejection motor 34 are connected.

The interface 111 performs communication of commands and data with a mother apparatus. The buffer memory 112 is used for storing recording/reproduction data temporarily and used as a work memory area used in common by the interface 111, MPU 113, and the optical disk controller 114.

The MPU 113 controls the entire device based on a previously provided firmware. The optical disk controller 114 performs processing required for reading/writing of data from/to the magneto-optical disk 2.

The write LSI 115 internally includes a write modulation circuit and a laser diode control circuit, converts write data provided from the optical disk controller 114 into PPM record data or PWM record data according to a medium type, and supplies it to the laser diode unit 131. The laser diode unit 131 is formed in the fixed optical system 23, and emits the laser beam based on the data provided by the write LSI 115. The laser beam emitted by the laser diode unit 131 is supplied to the carriage 24 through the fixed optical system 23.

The read LSI 116 internally includes a read recovery circuit and a frequency synthesizer, creates a read clock signal and lead data from an ID signal and an MO signal from the head amplifier 133, and restores original data. Based on the temperature detected signal from the temperature sensor 134, the focal error signal from the FES detection circuit 118, the tracking error signal from the TES detection circuit 119 and the zero crossing signal from the zero crossing detection circuit 120, the DSP 117 performs servo control.

The FES detection circuit 118 detects focal error based on the detection signal obtained from the multi-division detector 137. The TES detection circuit 119 detects tracking error based on the detection signal from the multi-division detector 137. The multi-division detector 117 is fixed to the fixed optical system 23, and converts the reflected light from the magneto-optical disk 2 into the electric detection signal.

The driver circuit 121 generates the drive signal for driving the spindle motor 35 according to the direction value from the DSP 117, and supplies it to the spindle motor 35. The driver circuit 122 drives the magnetic field application device 35 according to the current instruction value given by the DSP 117.

The magnetic field application device 35 includes an electromagnet, can change the bias magnetic field applied to the magneto-optical disk 2 according to the drive signal given by the driver circuit 122.

The driver circuit 123 drives the focusing actuator 138 according to the focal control signal from the DSP 117. The driver circuit 124 drives the lens actuator 139 according to the tracking instruction value from the DSP 117. The driver 25 drives the positioner 24b according to the positioning instruction value from the DSP 117.

At this time, the bias magnetic field application device 35 is driven according to a PWM (pulse width modulation) form. With regard to a specific driving method for the bias magnetic field application device 35, Japanese Laid-Open Patent Applications Nos. 9-44924 and 2000-245192 disclose, for example.

The technology by which control of electric current is performed by a current detection circuit and an MPU by using a PWM drive circuit for a bias coil generating a magnetic field by an H bridge circuit is disclosed by Japanese Laid-Open Patent Application Nos. 9-44924 and 2000-245192. Therein, the Off time/interval in the PWM control is fixed.

For such an optical disk device using super-resolution technology in the related art, the intensity of the reproduction magnetic field used at the time of reproduction should be controlled strictly. Otherwise, there may occur a problem that information reproduction cannot be performed properly.

Then, a recording/reproducing method for an optical storage device and an optical recording medium in which the intensity of the external (bias) magnetic field used is appropriately set at the time of reproduction, and the level decrease in reproduction signal is avoided and thus a situation in which reproduction cannot be performed properly is prevented from occurring in case super-resolution technology is employed are disclosed by Japanese Laid-Open Patent Application No. 11-25539. Also in this case, the OFF time/interval in the PWM control is fixed.

However, in a PWM control system in which a fixed OFF time/interval is used as mentioned above, the linearity of an actually flowing bias electric current with respect to a current instruction value may not be satisfactory, as a result, the resulting bias magnetic field (generated by the bias magnetic field application device including the coil according to the bias electric current) may not be controlled properly, and, accordingly, there may be a problem in which information reproduction cannot be performed properly.

Moreover, when the linearity is respected too seriously, a possibility increases in that the ripple noise in power supply may become enlarged in a large bias electric current flowing occasion, and the operation of the device may thus become unstable.

SUMMARY OF THE INVENTION

The present invention has been made in consideration of the above-mentioned points, and an object of the present invention is to provide a coil current control circuit, an information storage apparatus, and a coil current control method for driving a bias magnetic field application device employing a coil in an information storage apparatus appropriately even for a small electric current instruction value.

A coil driving circuit according to the present invention which supplies a predetermined electric current to a coil by changing a pulse width of a voltage applied to the coil according to a current instruction value so as to drive the coil. This circuit includes:

a current detection part which detects an electric current which flows through the coil;

a comparison part which compares a detection current value detected by the current detection part with the current instruction value;

a current control part which turns on/off the voltage applied to the coil according to a comparison result of the comparison part; and an off time control part which controls an off time for which application of the voltage to the coil is interrupted, according to the current instruction value.

Further, when the current instruction value is smaller, the off time may be set so that the off time become longer. In contrast thereto, when the current instruction value is larger, the off time may be set so that the off time become shorter.

Moreover, bit shift of the current instruction value may be performed and the off time may be determined according to the thus-obtained bit-shifted value, or, the off time may be determined according to an off time table in which the off time with respect to the current instruction value is previously stored.

According to the present invention, when the bias current instruction value is small, the off time is set so that the off time becomes longer. In contrast thereto, when the bias current instruction value is larger, the off time is set so that the off time becomes shorter. Thereby, the linearity of actual bias electric current actually flowing through the coil with respect to the bias current instruction value can be improved, as a result of positive reduction in the current for a small current value occasion being able to be achieved. Furthermore, problematically reduction in the electric current due to the off time at a time a large electric current flows can be prevented, and, thereby, the ripple noise can be effectively reduced.

BRIEF DESCRIPTION OF THE DRAWINGS

Other objects and further features of the present invention will become more apparent from the following detailed description when read in conjunction with the accompanying drawings.

FIG. 4 shows a block diagram of the magneto-optical disk device shown in FIG. 2;

FIG. 7 shows a truth value table of the driver IC shown in FIG. 6;

FIGS. 10A and 10B illustrate a data configuration of a bias magnetic field setting table in the embodiment of the present invention;

FIG. 11 illustrates a data configuration of an OFF time table shown in FIG. 8;

DETAILED DESCRIPTION OF THE PREFERRED EMBODIMENTS

An embodiment of the present invention is different from the magneto-optical disk device 1 in the related art described above, in a driver circuit 210 which drives the bias magnetic field application device 35 and control of the driver circuit 210 performed by the DSP 117. The other configuration and operation are the same as those of the magneto-optical disk device 1 in the related art described above, and duplicated description is omitted.

Figures 1A, 1B:
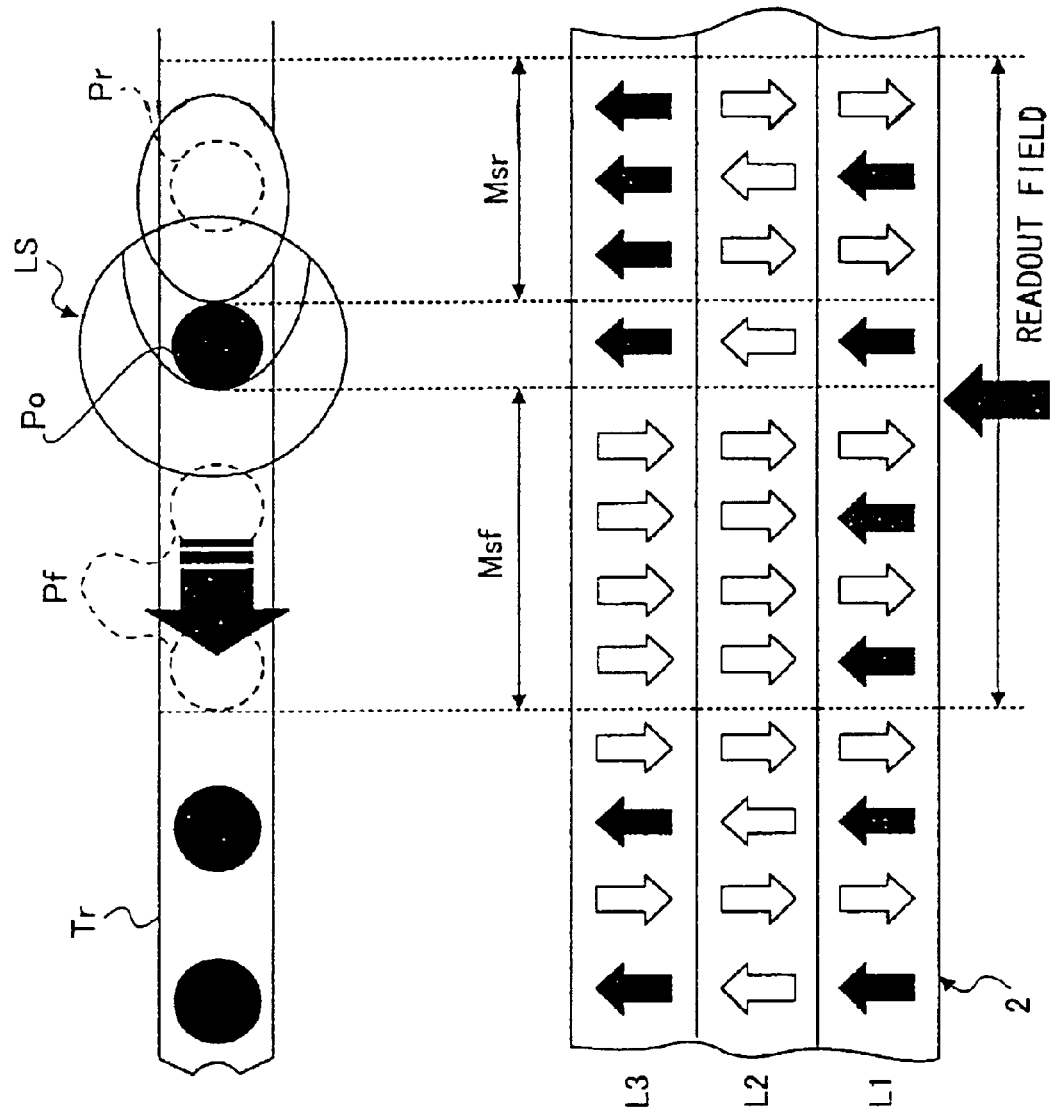
FIGS. 1A and 1B illustrate principle of super-resolution technology.
Figure 2:
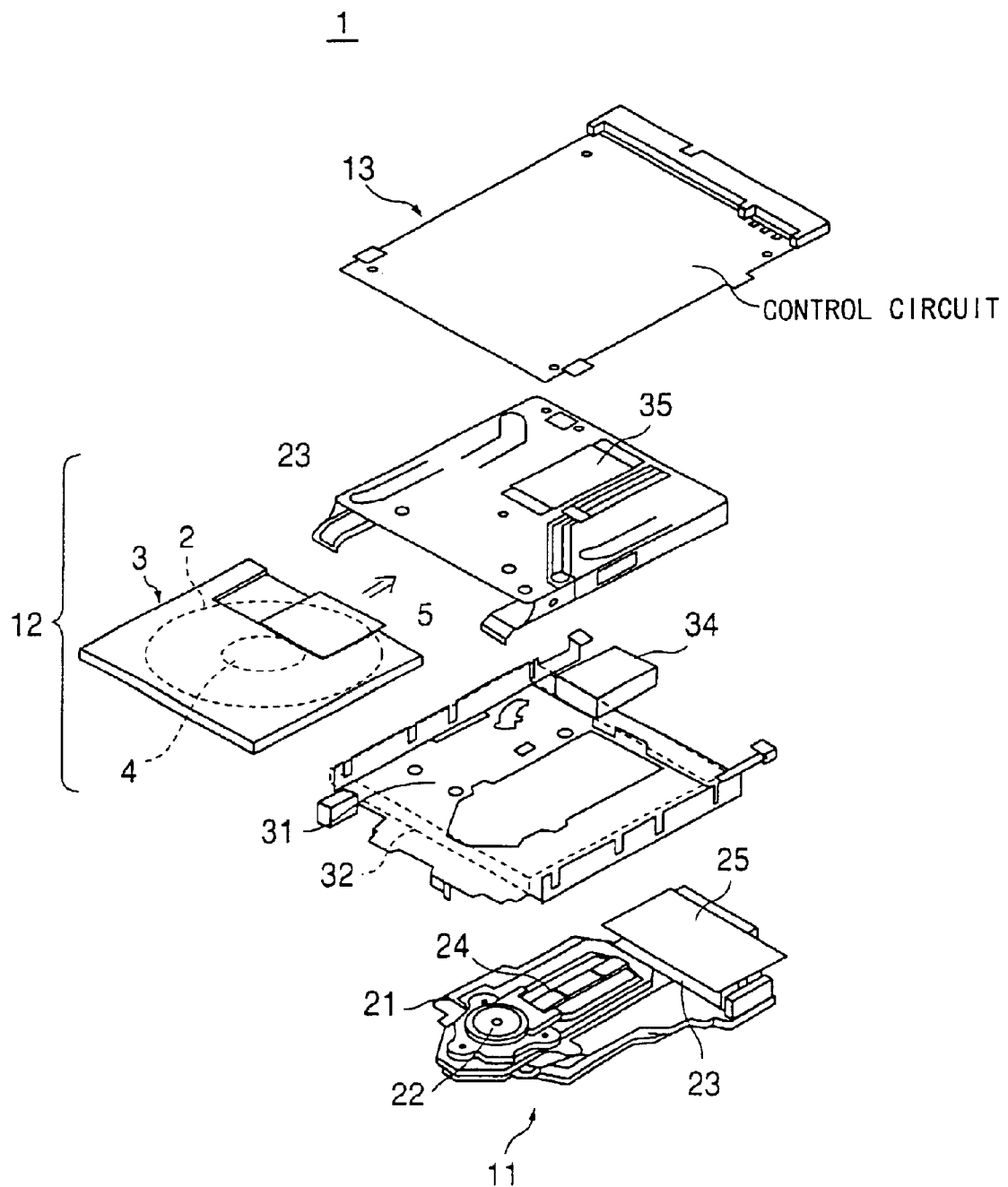
FIG. 2 shows an exploded perspective view of a magneto-optical disk device to which the present invention may be applied.
Figure 3A:
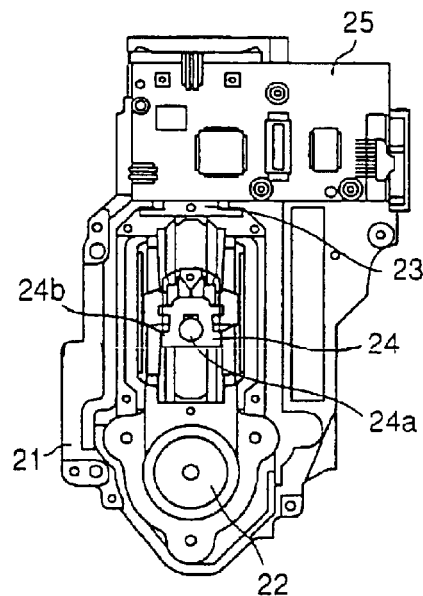
FIGS. 3A through 3C show a configuration of a base assembly shown in FIG. 2.
Figure 3B:
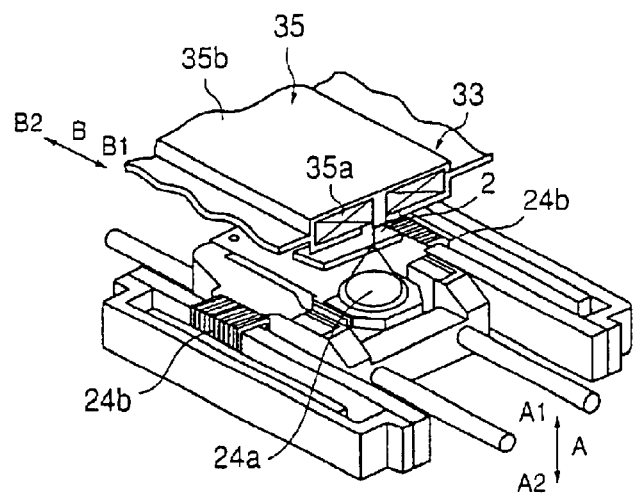
Figure 3C:
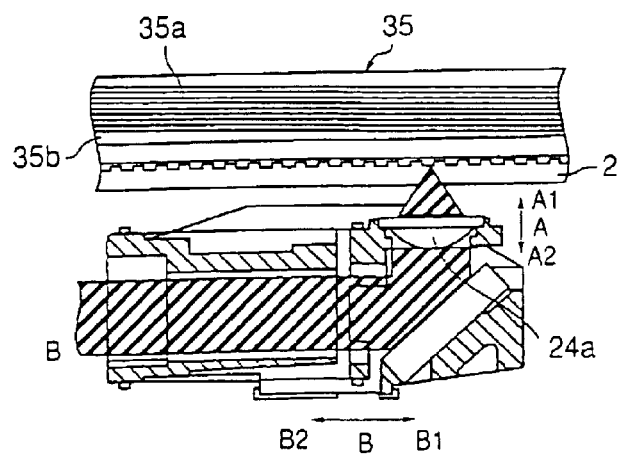
Figure 5:
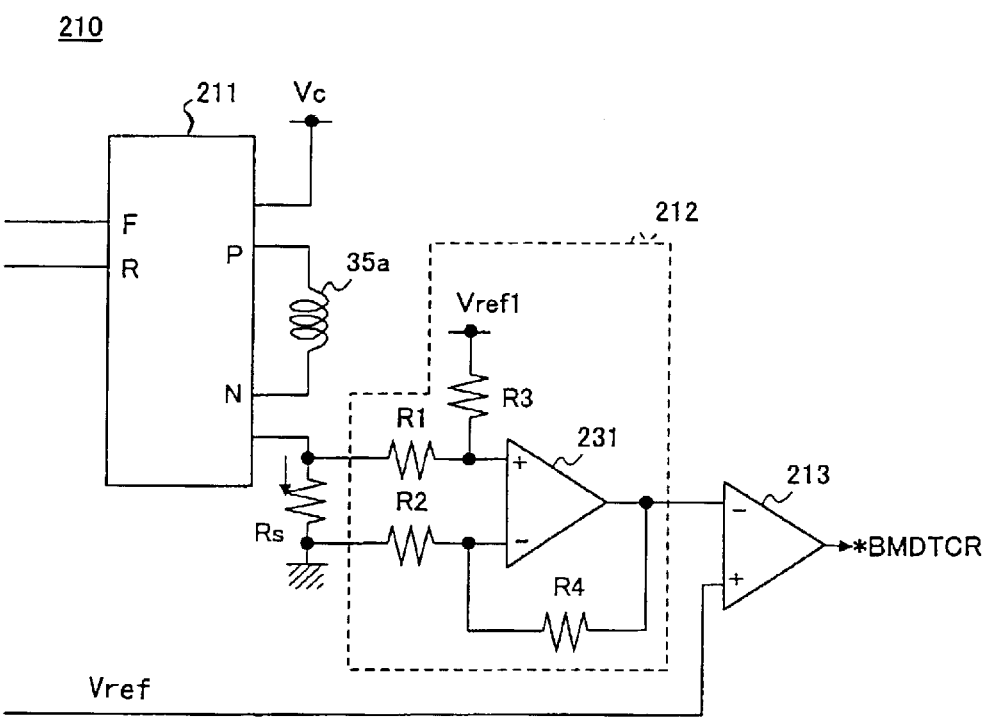
FIG. 5 shows a block diagram of a drive circuit (driver) shown in FIG. 4 in one embodiment of the present invention.
Figure 6:
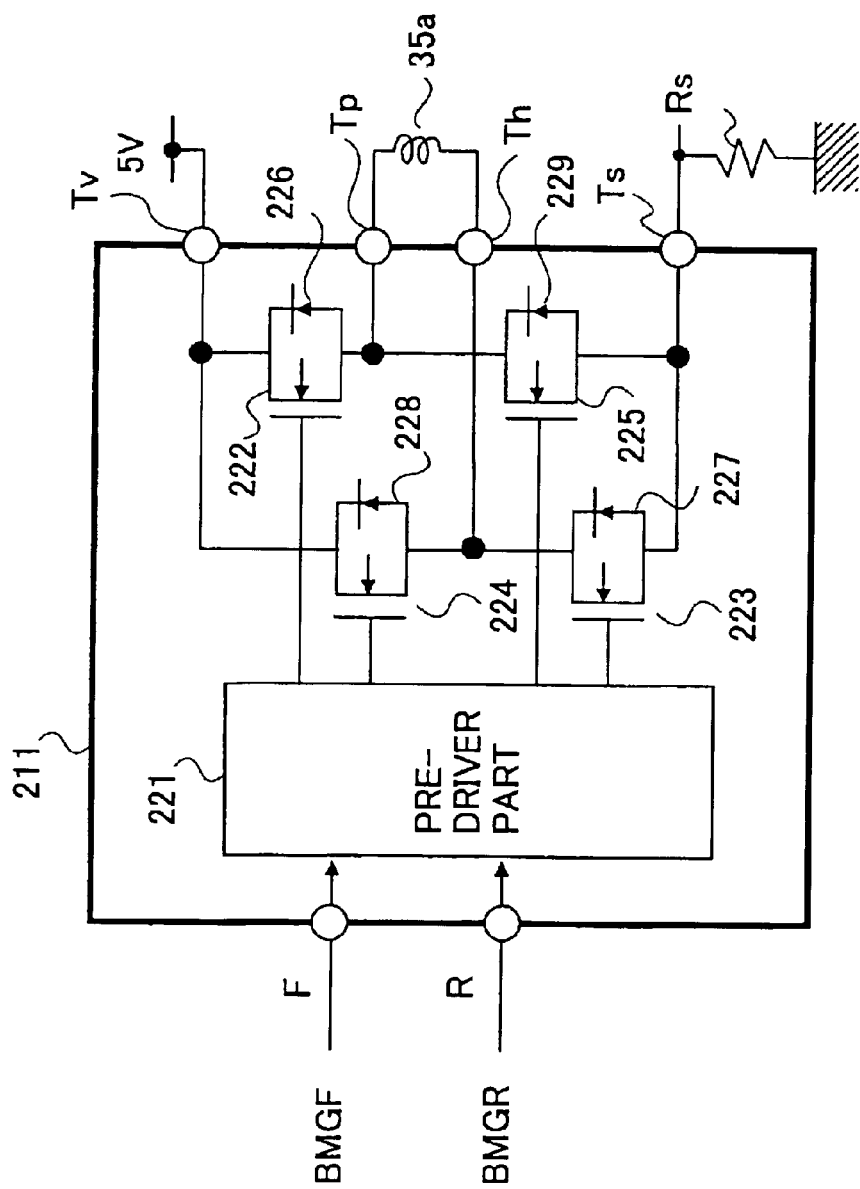
FIG. 6 shows a circuit diagram of a driver IC shown in FIG. 5.

FIG. 5 shows a block diagram of the driver circuit in the embodiment of the present invention, FIG. 6 shows a circuit configuration of a driver IC, and FIG. 7 shows a truth value table of the driver IC shown in FIG. 6.

The driver circuit 210 includes the driver IC 211, a current detection resistance Rs, a current detection circuit 212, and a comparison circuit 213.

The driver IC 211 includes a pre-driver part 221, transistors 222–225, and built-in diodes 226–229 of the transistors. To the driver IC 211, a first control signal BMGF and a second control signal BMGR, which will be described later, are supplied from the DSP 117.

The gate of the transistor 222 is connected to the pre-driver part 221, the drain-source thereof is connected between a power supply terminal Tv and a positive terminal Tn for the coil 35a. The anode of the built-in diode 226 of the transistor 222 is connected to the positive terminal Tp for the coil 35a, the cathode thereof is connected to the power supply terminal Tv, and functions as a flywheel diode. The gate of the transistor 223 is connected to the pre-driver part 221 and, the drain-source thereof is connected between the negative terminal Tp for the coil 35a and a detection terminal Ts. The anode of the built-in diode 227 of the transistor 223 is connected to the current detection terminal Ts, and the cathode thereof is connected to the negative terminal Tn for the coil 35a, and functions as a flywheel diode.

The gate of the transistor 224 is connected to the pre-driver part 221, and the drain-source thereof is connected between the power supply terminal Tv and the negative terminal Tn for the coil 35a. The anode of the built-in diode 228 of the transistor 224 is connected to the negative terminal Tn, and the cathode thereof is connected to the power supply terminal Tv, and functions as a flywheel diode. The gate of the transistor 225 is connected to the pre-driver part 221 and, the drain-source thereof is connected between the positive terminal Tp for the coil 35a and the detection terminal Ts. The anode of the built-in diode 229 of the transistor 225 is connected to the current detection terminal Ts, and, the cathode is connected to the positive terminal Tp for the coil 35a.

A power supply voltage Vcc is applied to the power supply terminal Tv. Between the positive terminal Tp and negative terminal Tn, the coil 35a of the bias magnetic field application device 35 mentioned above is connected as shown in FIG. 6. A current detection resistance Rs is connected between the current detection terminal Ts and be ground.

The pre-driver part 221 operates, when the first control signal BMGF is in a high level and the second control signal BMGR is in a low level, to turn on the transistors 222 and 223, and turn off the transistors 224 and 225. Thereby, as shown in FIG. 7, the bias electric current flows from the positive terminal Tp toward the negative terminal Tn through the coil 35a. In contrast thereto, when the first control signal BMGF is in a low level, and the second control signal BMGR is in a high-level, the transistors 224 and 225 are turned on and the transistors 222 and 223 are turned off. Thereby, the bias electric current flows from the negative terminal Tn toward the positive terminal Tp through the coil 35a. Furthermore, when both the first control signal BMGF and second control signal BMGR are in low levels, the transistors 222 and 224 are turned off and the transistors 223 and 225 are turned on. Thereby, no bias electric current flows through the coil 35a as a result of the both ends of the coil 35a being made to have the same electric potential.

When both the first and second control signals BMGF/BMGR become in the low levels after a mode in which the bias current flows toward the negative terminal Tn from the positive terminal Tp through the coil 35a, the current having flown through the coil 35a then flows in a path of the terminal Tn→the transistor 223→the detection terminal Ts→the transistor 225→the positive terminal Tp, thereby, the energy is heat-consumed. However, in case where, the first control signal BMGF becomes in the low level and also the second control signal BMGR becomes in the high level before the current becomes zero, the current having flown toward the negative terminal Tn from the positive terminal Tp through the coil 35a then flows in a path of GND→the detection resistance Rs→the detection terminal Ts→the diode 229→the diode 228→the power supply terminal Tv→the power supply Vcc. Thus, the current is revived to the power source.

Similarly, the first and second control signals BMGF/BMGR become in the low level after a mode in which the current flows toward the positive terminal Tp from the negative terminal Tn, the current having flown through the coil 35a then flows in a path of the positive terminal Tp→the transistor 225→the detection terminal Ts→the transistor 223→the negative terminal Tn. Thus, the energy is heat-consumed. However, in case where the first control signal BMGF becomes in the high level and also the second control signal BMGR becomes in the low level before the current becomes zero, the current having flown toward the positive terminal Tp from the negative terminal Tn through the coil 35a then flows in a path of GND→the detection resistance Rs→the detection terminal Ts→the diode 227→the diode 226→the power supply terminal Tv→the power supply Vcc. Thus, the current is revived into the power source.

Thus, the polarities of the bias magnetic field generated by the bias magnetic field application device 35 including the coil 35a are switched by the first control signal BMGF and second control signal BMGR.

The current detection resistance Rs is connected between the current detection terminal Ts of the driver IC 211, and the ground. The current detection resistance Rs has the electric current which flows through the coil 35a flow therethrough. Thereby, a voltage according to the current which flows through the coil 35a is generated between both ends of the current detection resistance Rs.

The current detection circuit 212 includes a differential amplifier including resistances R1–R4 and an operational amplifier 231, as shown in FIG. 5. The current detection circuit 212 outputs an output signal according to the voltage between both ends of the current detection resistance Rs. The output signal of the current detection circuit 212 is supplied to an inverted input terminal of the comparison circuit 213.

A reference voltage Vref is supplied to the comparison circuit 213 from the DSP 117. In addition, a setting current value is determined by this reference voltage Vref. The comparison circuit 213 compares the output signal from the current detection circuit 212 with the reference voltage Vref from the DSP 117, and outputs a high level when the output signal from the current detection circuit 212 is lower than the reference voltage Vref but outputs a low level when the output signal from the current detection circuit 212 is higher than the reference voltage Vref. The output signal of the comparison circuit 213 is supplied to the DSP 117.

Figure 8:
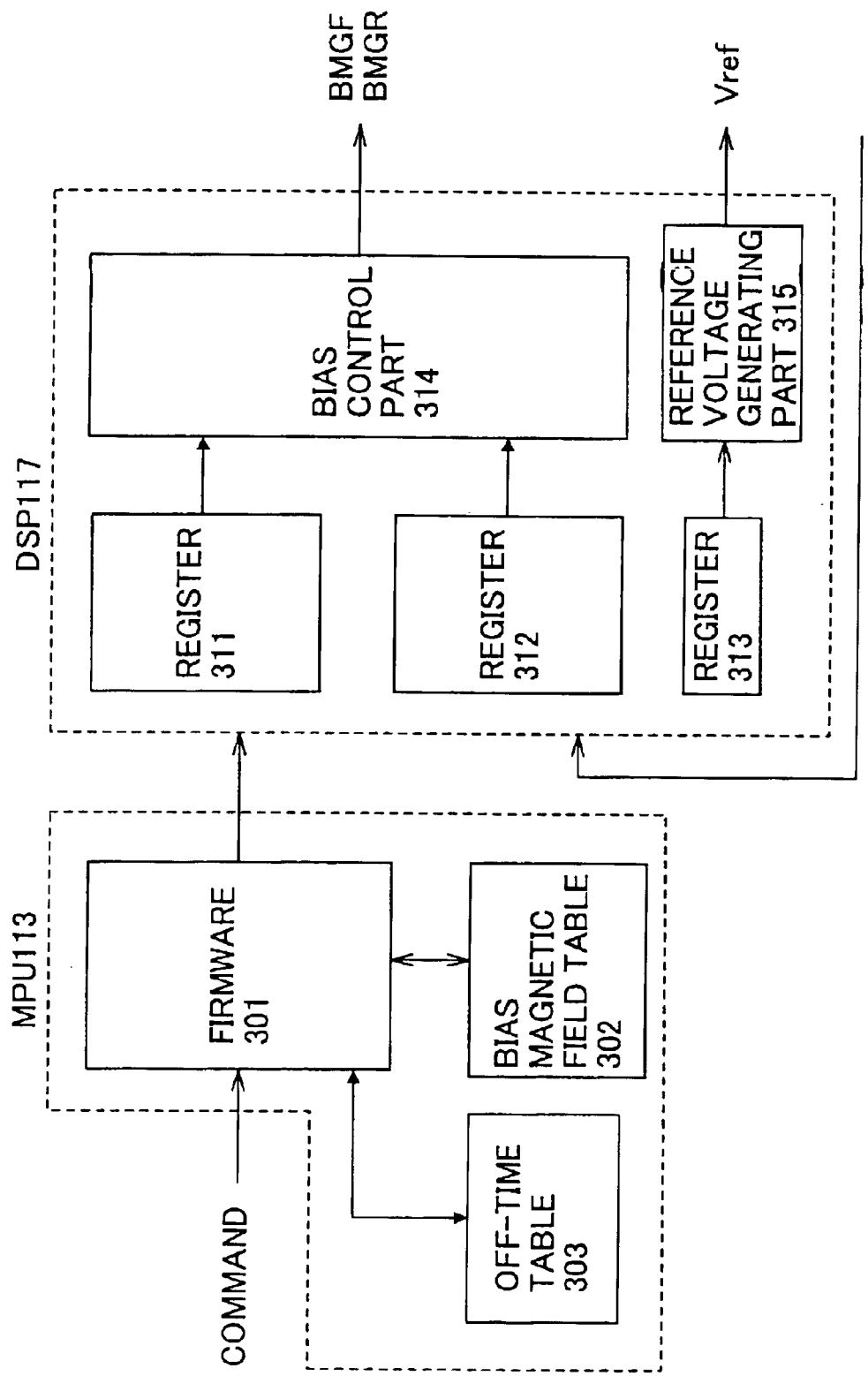
FIG. 8 shows a block diagram of a bias magnetic field control system in the embodiment of the present invention.

FIG. 8 shows a block diagram of a bias magnetic field control system in the embodiment of the present invention.

The bias magnetic field control system mainly includes a firmware 301, a bias magnetic field setting table 302, registers 311 through 313, a bias control part 314, and a reference voltage generation part 315. For example, the firmware 301 and bias magnetic field setting table 302 are included in the MPU 113, and the registers 311 through 313, bias control part 314, and reference voltage generation part 315 are included in the DSP 117, as shown in FIG. 8.

Figure 9:
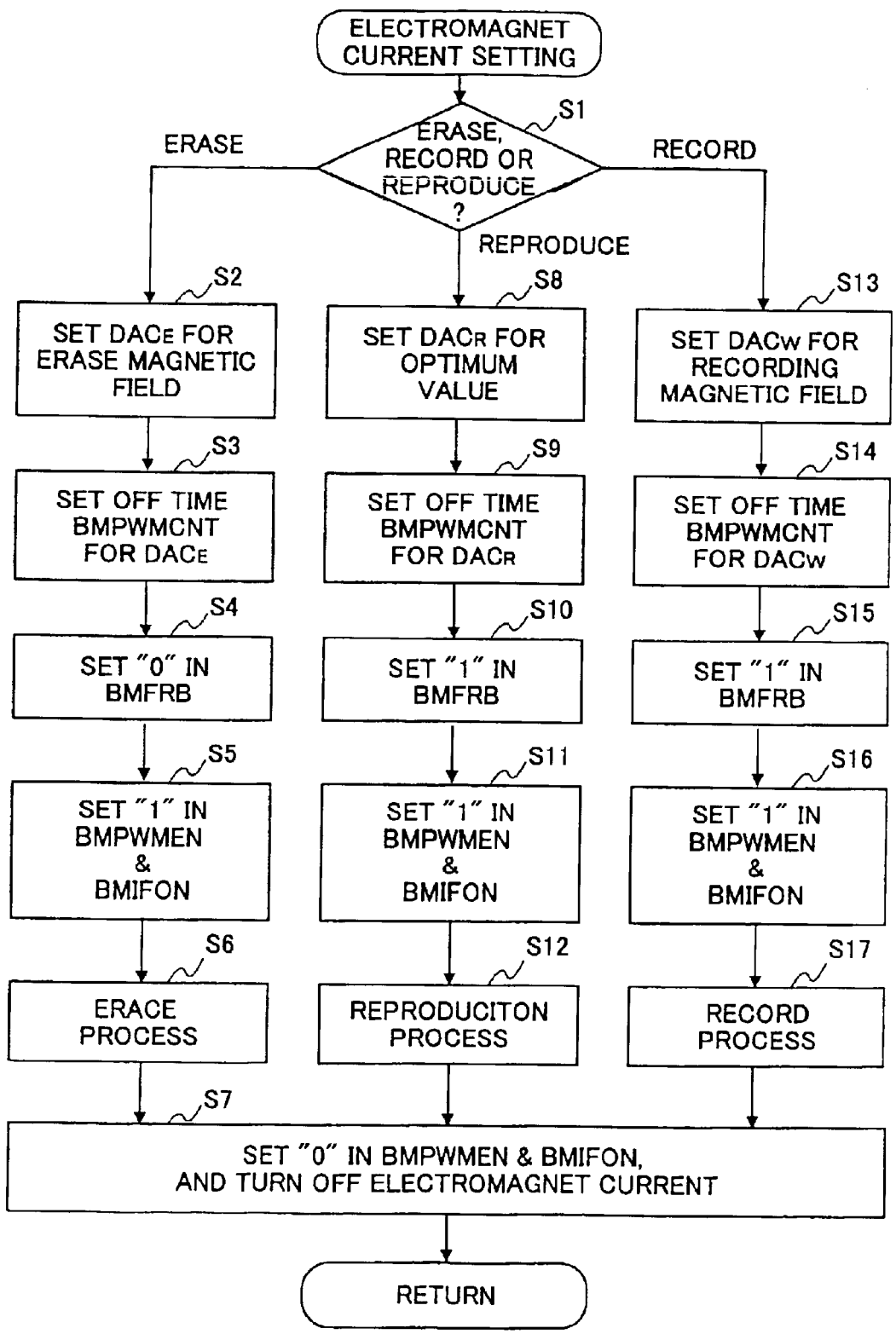
FIG. 9 shows an operation flow chart of a firmware in the embodiment of the present invention.

FIG. 9 shows an operation flow chart of the firmware 301 in the embodiment of the present invention.

The firmware 301 analyzes a command from a host at a step S1, and determines whether it is directed to an erase operation, a recording operation, or a reproducing operation. At the step S1, when the given command is directed to an erase operation, a reference is made to the bias magnetic field setting table 302 at a step S2, and a setting value $DAC_E$ for causing the bias electric current of an erase bias magnetic field current value $I_E$ to flow through the coil 35a is set to the register 313. The setting value $DAC_E$ set to the register 313 is supplied to the reference voltage generation part 315. The reference voltage generation part 315 outputs the reference voltage Vref according to the set setting value $DAC_E$ to the comparison circuit 213.

The bias magnetic field setting table 302 will now be described.

FIGS. 10A and 10B illustrate a data configuration of the bias magnetic field setting table 302 in the embodiment of the present invention. FIG. 10A shows the data configuration of the bias magnetic field setting table 302, and FIG. 10B shows a zone configuration of the magneto-optical disk 2.

As shown in FIG. 10A, in the bias magnetic field setting table 302, a setting value $DAC_E$ for determining the erase setting current value $I_E$, a setting value $DAC_W$ for determining a recording setting current value $I_W$ and setting values $DAC_{RZ1}$, through $DAC_{RZ11}$ for determining reproduction initial setting current values $I_{RZ1}$ through $I_{RZ11}$, and calibration coefficients α1 through α11 are stored. The setting values $DAC_{RZ1}$ through $DAC_{RZ11}$ for determining the reproduction initial setting current values $I_{RZ1}$ through $I_{RZ11}$, and calibration coefficients α1 through α11 stored are previously set for previously setting zones Z1 through Z11.

The zones Z1 through Z11 are zones obtained through division of a recording surface of the magneto-optical disk 2 along a radius direction R of the magneto-optical disk 2 in circumference shape as shown in FIG. 10B. Actually, the reproduction setting current values are obtained from multiplying the reproduction initial setting current values $I_{RZ1}$ through $I_{RZ11}$ with the corresponding calculation coefficients α1 through α11, respectively.

The setting values $DAC_{RZ1}$ through $DAC_{RZ11}$ for determining the initial reproduction current values $I_{RZ1}$ through $I_{RZ11}$ are previously stored in the bias magnetic field setting table 302 as predetermined values, in a debugging stage. Moreover, the calibration coefficients α1 through α11 are determined and updated by a reproduction magnetic field calibration process such as that shown in FIG. 12 of Japanese Patent Application No. 9-173593, for example.

Next, the firmware 301 reads an OFF time count value BMPWMCNT corresponding to the setting value $DAC_E$ read from the bias magnetic field setting table 302 at a step S3 from the OFF time table 303, and stores it in the register 311. At least 8-bit storage area is secured in the resister 311, and, therein, 8-bit information corresponding to the OFF time setting value DAC can be stored.

Next, "0" is set to a BMFRB bit of the register 312 at a step S4. At least 3-bit storage area of a BMIFON bit, a BMPWMEN bit, and the BMFRB bit is secured in the register 312, and, to each bit, information of "1" or "0" is set according to the operation.

The firmware 301 performs erase processing at a step S6, when "1" is set to both the BMPWMEN bit and BMIFON bit of the register 312 at a step S5. The BMPWMEN bit and BMIFON bit of the register 312 are set to "0" at a step S7 after the erase processing is completed.

Moreover, when the input command is directed to a record operation at the step S1, the firmware 301 reads the OFF time setting value $DAC_W$ for causing an optimum current value $I_W$ to flow the coil 35a, from the bias magnetic field setting table 302 at a step S13.

Furthermore, at a step S14, the count value BMPWMCNT corresponding to the OFF time setting value $DAC_W$ read is read from the OFF time table 303, and it is set to the register 311. Moreover, "1" is set to the BMFRB bit of the register 312 at a step S15, and "1" is set to both the BMPWMEN bit and BMIFON bit of the register 312 at a step S16. Then, recording processing is performed at a step S17, the BMPWMEN bit and BMIFON bit of the register 312 are set to "0" at the step S7, and thus the electric current flowing through the coil 35a is turned off.

Furthermore, when the input command is directed to a reproduction operation at the step S1, the firmware 301 reads the setting value $DAC_R$ for causing the current value $I_R$ to flow through the coil 35a, and reads the calibration coefficient α stored in the bias magnetic field setting table 302, at a step S8. At this time, the setting value $DAC_R$ and calibration coefficient a corresponding to the zone of the zones Z1 through Z11 from which reproduction is made, and the value obtained from multiplying the setting value $DAC_R$ with the calibration coefficient α is set to the register 313.

Furthermore, at a step S9, the OFF time count value BMPWMCNT corresponding to the read setting value $DAC_R$ is read from the OFF time table 303, and it is set to the register 311.

FIG. 11 shows a data configuration of the OFF time table 303.

In the OFF time table 303, as shown in FIG. 11, the OFF time count value BMPWMCNT corresponding to the setting value $DAC_R$ is stored. For example, for "0x00" through "0x0f" of the setting value $DAC_R$, the OFF time count value "0x18" is set; for "0x10" through "0x1f" of the setting value $DAC_R$, the OFF time count value "0x10" is set; for "0x20" through "0x3f" of the setting value $DAC_R$, the OFF time count value "0x08" is set; for "0x40" through "0x7f" of the setting value $DAC_R$, the OFF time count value "0x04" is set; and for "0x80" through "0xff" of the setting value, the OFF time count value "0x01" is set.

Next, "1" is set to the BMFRB bit of the register 312 at a step S10, and "1" is set to both the BMPWMEN bit and BMIFON bit of the register 312 at a step S11. Reproduction/check processing is performed at a step S12, and, the BMPWMEN bit and BMIFON bit of the register 312 are set to "0" at a step S7. Then, the electric current flowing through the coil 35a is turned off.

Although the operation of setting up the OFF time using the OFF time table 303 has been described only for the reproduction operation, the OFF time is set up using the OFF time table 303 also for the erasing operation and recording operation.

The bias control part 314 performs control operation based on the values set to the above-mentioned registers 311 through 313.

Figure 12:
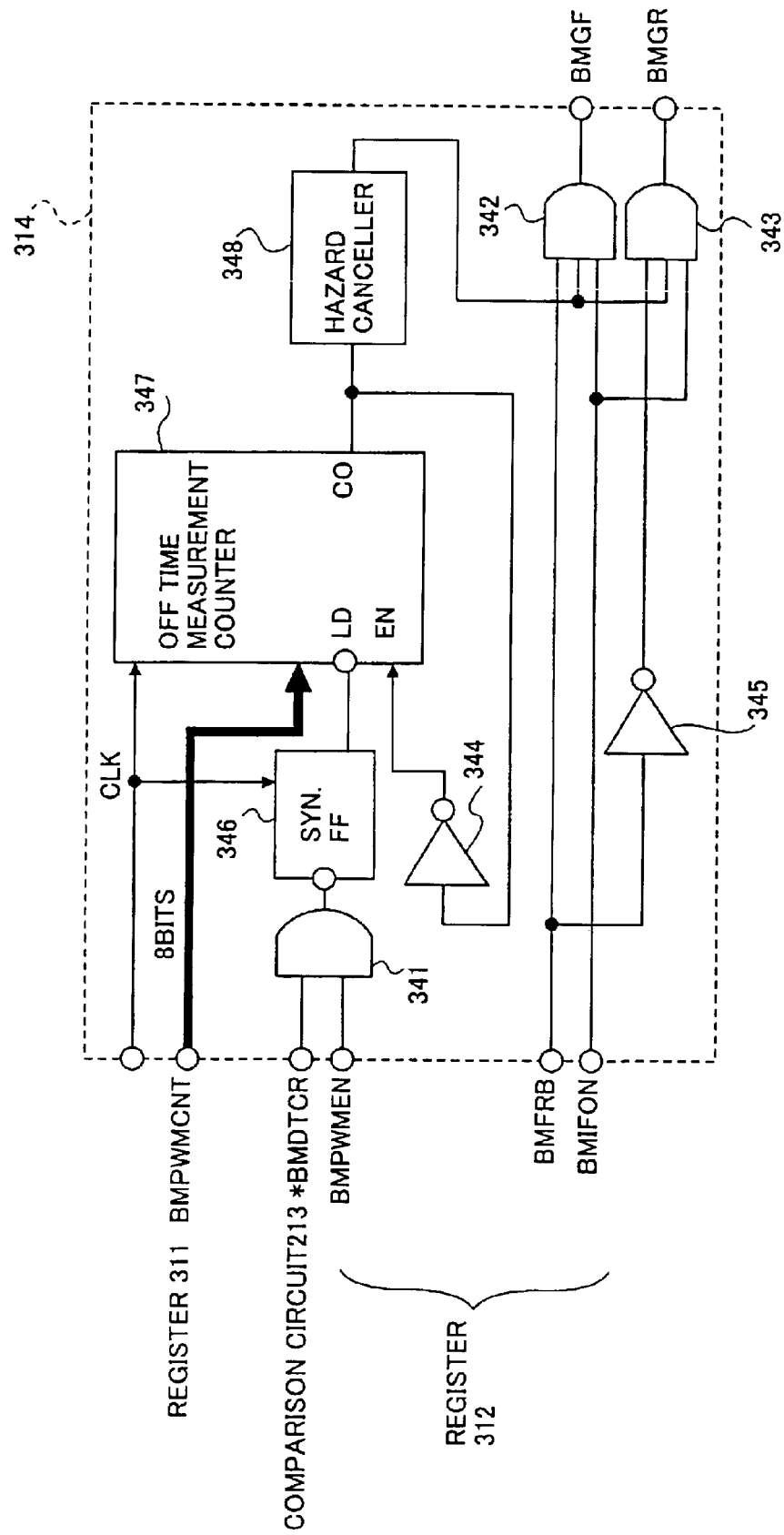
FIG. 12 shows a block diagram of a bias control part shown in FIG. 8.

FIG. 12 shows a block diagram of the bias control part 314 in the embodiment of the present invention. The bias control part 314 includes AND gates 341 through 343, inverters 344 and 345, a flip flop 346 for synchronization, a counter 347 for OFF period measurement, and a hazard canceller 348.

An OFF time count value BMPWMENCNT from the register 311, and an enable signal BMPWMEN, a direction setting signal BMFRB, and an interface-on signal BMIFON from the register 312, are supplied to the bias control part 314. Moreover, an inverted pulse *BMDTCR of an output pulse BMDTCR of the comparison circuit 213 is supplied to the bias control part 314.

The enable signal BMPWMEN from the register 312 and the output pulse *BMDTCR from the comparison circuit 213 are supplied to the AND gate 341.

The AND gate 341 outputs a high level when the bias enable signal BMPWMEN is effective and also the output pulse *BMDTCR of the comparison circuit 213 is in the high-level, i.e., when the coil detection current value is smaller than the current instruction value.

The output of the AND gate 341 is supplied to the flip flop 346 for synchronization. The flip flop 346 for synchronization synchronizes the output timing of the output pulse of the AND gate 314 with a clock signal CLK. The output of the flip flop 346 for synchronization is supplied to a load terminal LD of the counter 347 for OFF time measurement. The counter 347 for OFF time measurement loads thereto the OFF time count value BMPWMENCNT set in the register 311 in response to a rising edge of the output from the flip flop 346 for synchronization. The counter 347 for OFF time measurement counts predetermined clock pulses, and when the count value becomes the OFF time count value BMPWMENCNT loaded from the register 311, a count-up pulse is outputted from a count-up pulse terminal CO thereof.

The count-up pulse is supplied to the hazard canceller 348 and the inverter 344. The hazard canceller 348 removes noise of the count-up pulse. The count-up pulse from which the noise has been removed by the hazard canceller 348 is supplied to the AND gates 342 and 343.

While the count-up pulse is supplied from the hazard canceller 348 to the AND gate 342, the drive direction setting pulse BMFRB and interface-on pulse BMIFON are supplied to the AND gate 342 from the register 311, and, then, AND logic of the three inputs is outputted therefrom. The output of the AND gate 342 is supplied to the driver IC 211 as the forward direction drive instruction signal BMGF shown in FIG. 6.

While the count-up pulse is supplied from the hazard canceller 348 to the AND gate 343, the inverted drive direction setting pulse *BMFRB obtained from inverting the drive direction setting pulse BMFRB through the inverter 345 and the interface-on pulse BMIFON from the register 312 are supplied to the AND gate 343, and, then, AND logic of the three inputs is outputted therefrom. The output of the AND gate 343 is supplied to the driver IC 211 as a reverse direction drive instruction signal BMGR shown in FIG. 6.

Figure 13:
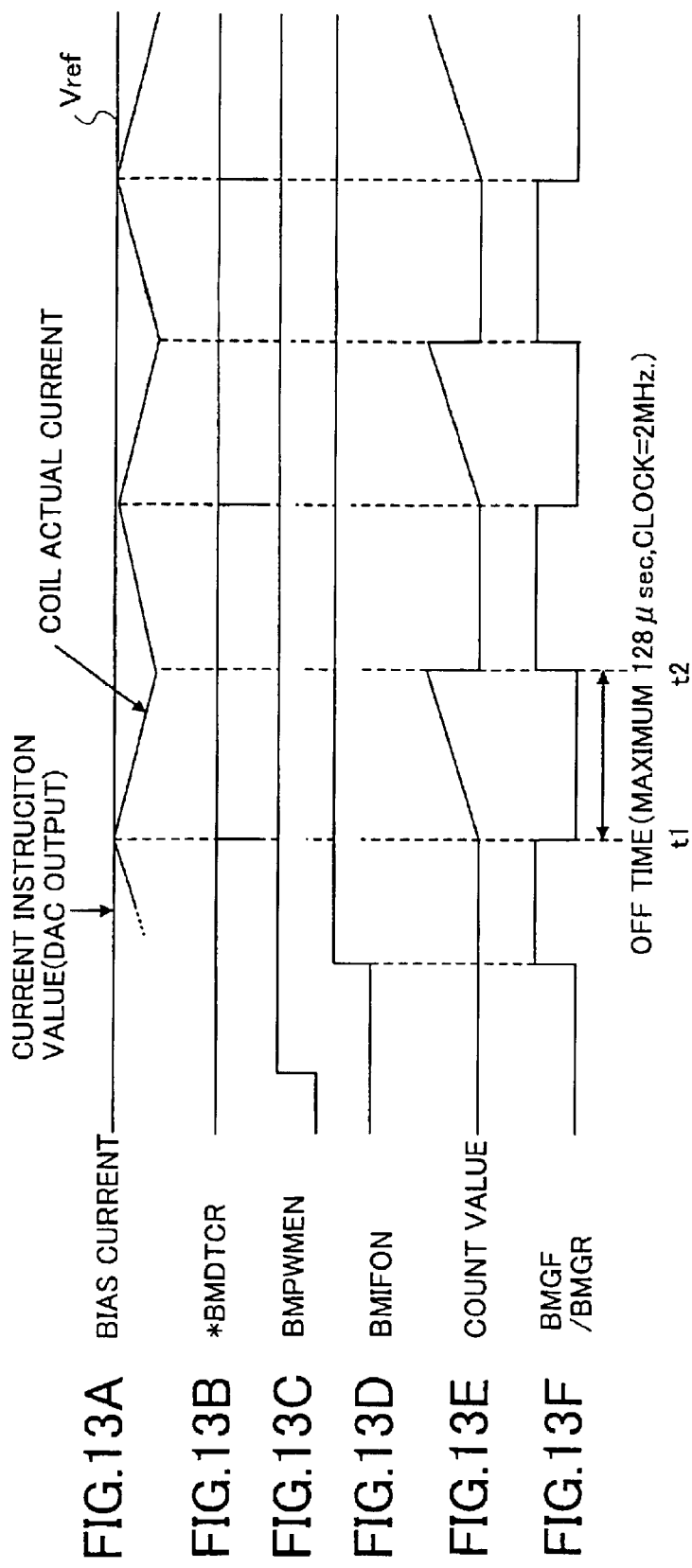
FIGS. 13A through 13F show a time chart of operation of the bias control part shown in FIG. 12.

FIGS. 13A through 13F illustrate operation of the above-described bias control part 314. FIG. 13A shows the output of the current detection circuit 212; FIG. 13B shows the output pulse BMDTCR of the comparison circuit 213; FIG. 13C shows the enable signal BMPWMEN; FIG. 13D shows the interface-on signal BMIFON; FIG. 13E shows the count value of the counter 347 for OFF time measurement; and FIG. 13F shows the forward direction drive instruction signal BMGF.

After assertion of the enable signal BMPWMEN as shown in FIG. 13C, the interface-on signal BMIFON is asserted as shown in FIG. 13D. At this time, when the forward direction drive instruction signal BMGF is in the high level as shown in FIG. 13F, the electric current flowing through the coil 35a increases. The increase in the current flowing through the coil 35a as shown in FIG. 13A results in increase in the output of the current detection circuit 212.

When the output of the current detection circuit 212 becomes larger than the reference voltage Vref at a time t1 as shown in FIG. 13A, the output *BMDTCR of the comparison circuit 213 is set to the low level as shown in FIG. 13B.

As the output *BMTCR of the comparison circuit 213 is set to the low level, the count value BMPWMCNT set to the register 311 is then set to the counter 347 for OFF time measurement, and counting operation of the counter 347 for OFF time measurement is started, as shown in FIG. 13E. At this time, the count-up output of the counter 347 for OFF time measurement is set to a low level. As the count-up output of the counter 347 for OFF time measurement is set to the low level, the output of the AND gate 342 is set to the low level as shown in FIG. 13F.

When the counting operation of the counter 347 for OFF time measurement is started at a time t1 and the count value of the counter 347 for OFF time measurement reaches the OFF time count value BMPWMCNT at a time t2 as shown in FIG. 13F, the count-up output CO of the counter 347 for OFF time measurement becomes in the high level at the time t2. When the count-up output CO becomes in the high level, the output BMGF of the AND gate 342 becomes the high level, the bias electric current flowing through the coil 35a increases, and the same operation is repeated, as shown in FIGS. 13A through 13F. Thereby, the bias electric current flowing through the coil 35a is maintained approximately at a fixed value, as shown in FIG. 13A (coil actual current).

In the present embodiment, when the electric current provided to the coil 34a is small, the OFF time count value BMPWMCNT given to the counter 347 for OFF time measurement is set such that the OFF time becomes longer. Although the ripple noise in power supply becomes somewhat larger when the OFF time becomes longer, the linearity is improved compared with the case where the OFF time is shorter. The PWM efficiency is then improved by improving the linearity of the power supply.

Further, in the present embodiment, when the electric current provided to the coil 34a is large, the OFF time count value BMPWMCNT given to the counter 347 for OFF time measurement is set such that the OFF time becomes shorter. Although the PWM efficiency is somewhat degraded when the OFF time becomes shorter, the ripple noise in power supply can be reduced effectively, in comparison to the case where the OFF time is longer. Moreover, the linearity is in a level such as not to occur any problem.

Figure 14:
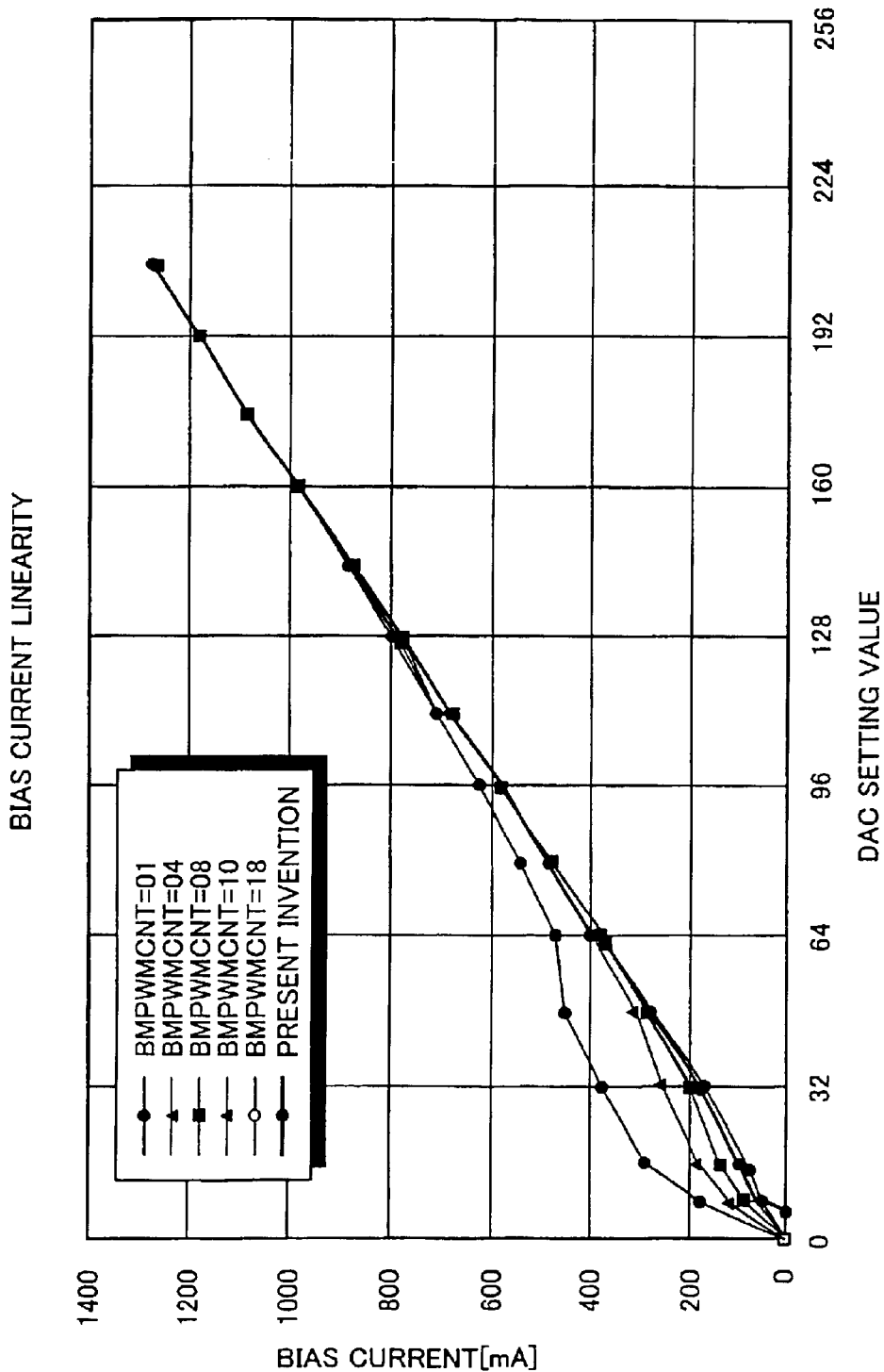
FIG. 14 shows change in bias current with respect to current setting value.

FIG. 14 shows the bias current with respect to the current setting value DAC at the time of changing the OFF time count value BMPWMCNT as "01", "04", "08", "10", and "18" based an the OFF time table.

Figure 15:
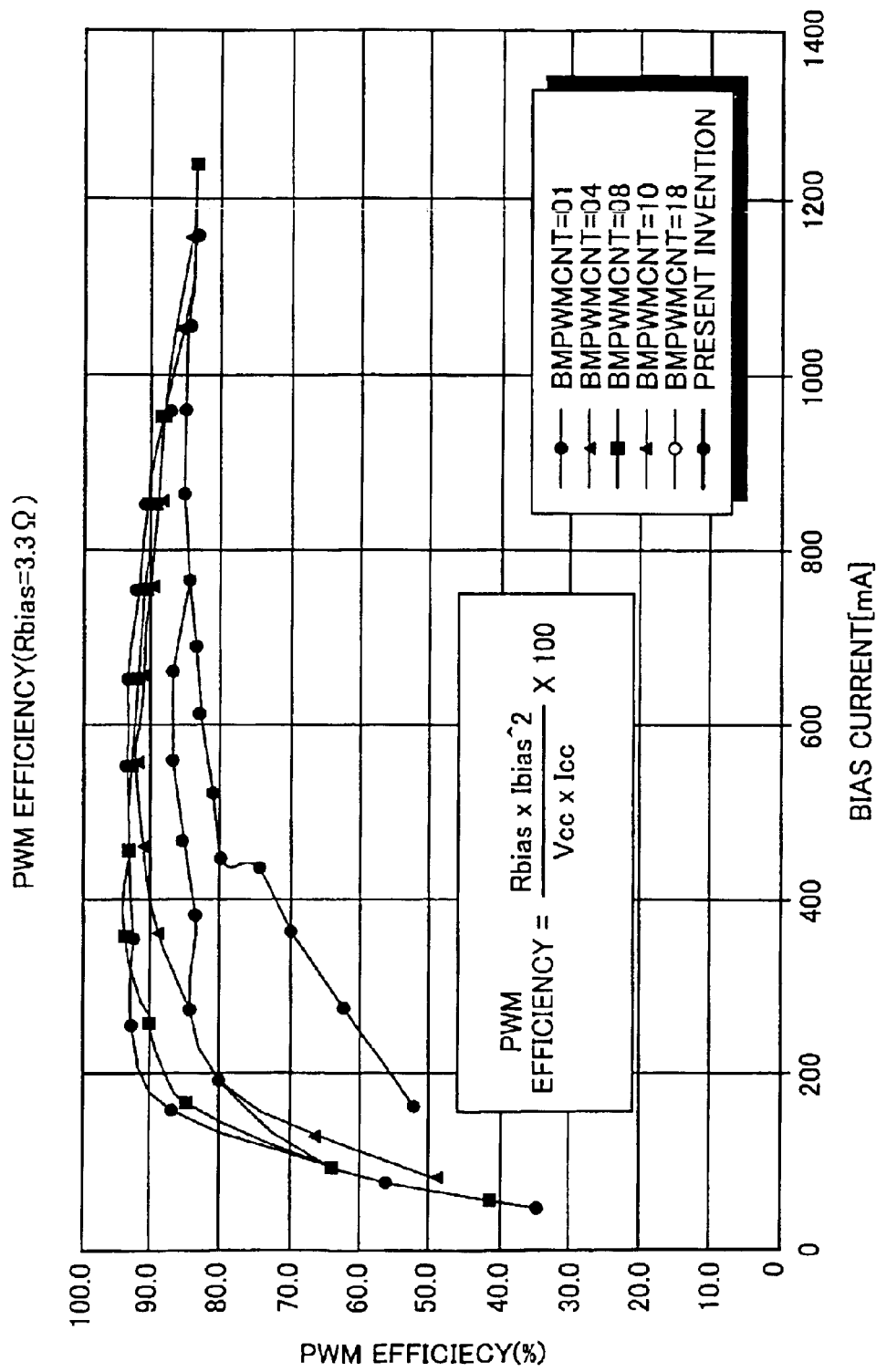
FIG. 15 shows change in PWM efficiency with respect to bias current.

Moreover, FIG. 15 shows the PWM efficiency with respect to the bias current at the time of changing the OFF time count value BMPWMCNT as "01", "04", "08", "10", and "18" based on the OFF time table.

Figure 16:
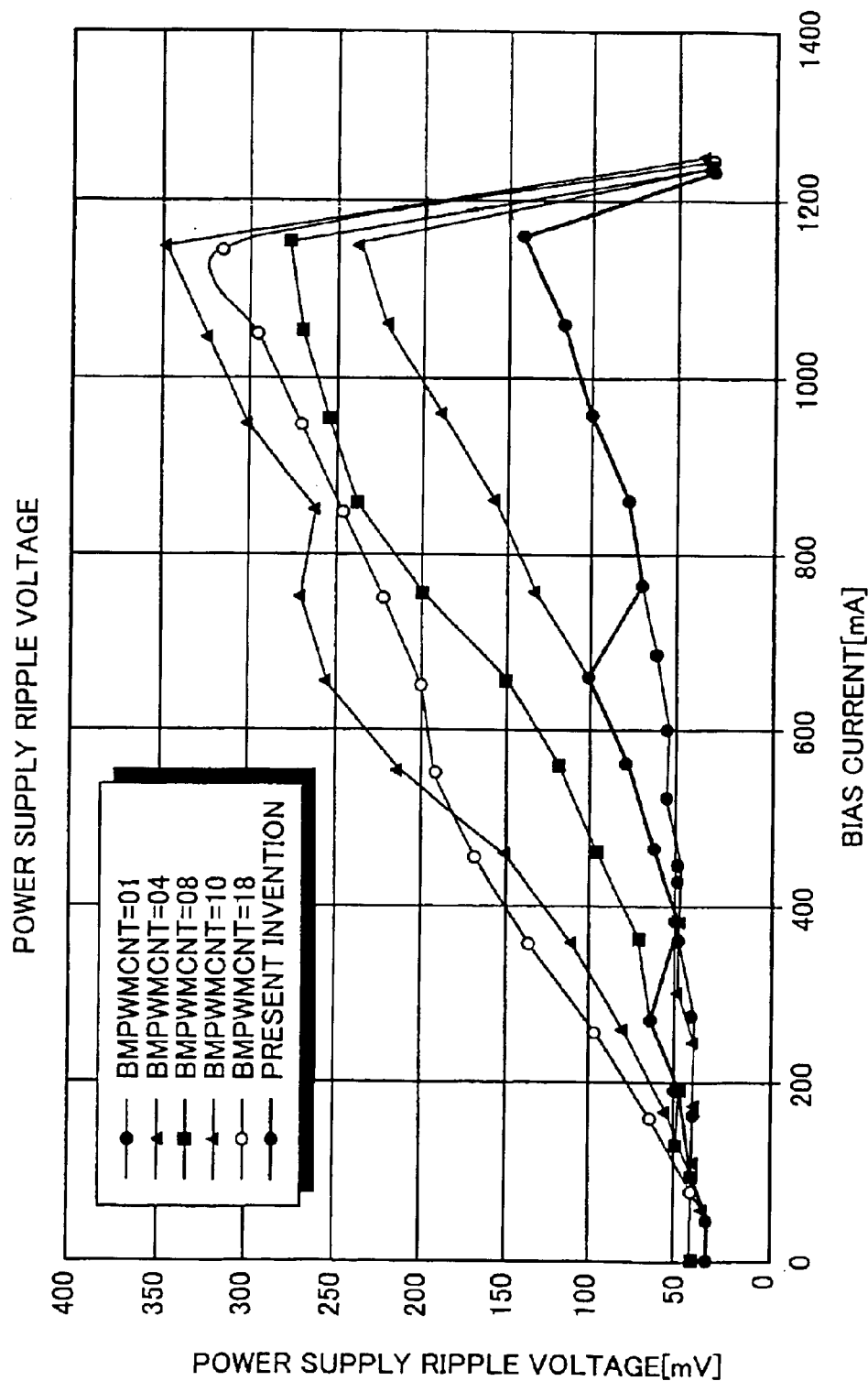
FIG. 16 shows change in power supply ripple voltage with respect to bias current.

Furthermore, FIG. 16 shows the power supply ripple voltage with respect to the bias current at the time of changing the OFF time count value BMPWMCNT as "01", "04", "08", "10", and "18" based on the OFF time table.

As shown in FIGS. 14 and 15, by enlarging the OFF time count value BMPWMCNT, i.e., elongating the OFF time, the linearity is improved and also, reduction in the loss in the driver, i.e., improvement in the PWM efficiency is possible. However, as shown in FIG. 16, the ripple noise in power supply becomes large in the large current zone.

Moreover, when the OFF time count value BMPWMCNT, i.e., the OFF time, is made smaller/shorter, although the power supply ripple noise can be reduced effectively, the linearity and PWM efficiency become degraded in the small current zone as shown in FIGS. 14 and 15.

According to the present embodiment, by appropriately switching/adjusting the OFF time/interval according to the setting value DAC, as shown in FIGS. 14 through 16, the linearity of the actual bias electric current with respect to the setting value DAC is improved, and the loss in the driver can be reduced, i.e., the PWM efficiency can be improved. Moreover, the power supply ripple noise can be prevented from increasing, while maintaining the linearity and the high efficiency of PWM. Therefore, when the present embodiment is used in a magneto-optical disk device, the power supply voltage can be stabilized and thereby the device can be operated stably. Moreover, the power consumption can be reduced.

In addition, although the OFF time count value BMPWMCNT is set up using the OFF time table according to the setting value DAC in the present embodiment, it is also possible to calculate the same from the setting value DAC instead.

A calculating method for the OFF time is, for example, such that, when the number of times of bit-by-bit shifting of the setting value DAC required until it reaches "0" is "8", the OFF time count value BMPWMCNT=0x01; when it is "7", the OFF time count value BMPWMCNT=0x04; when it is "6", the OFF time count value BMPWMCNT=0x08; when it is "5", the OFF time count value BMPWMCNT=0x10; when it is "4", the OFF time count value BMPWMCNT=0x18. The thus-calculated value is set to the register 311.

Moreover, although the present embodiment is for a magneto-optical disk device, it is possible to apply the present invention not only to a magneto-optical disk device but also to another kind of device in which an electric current supplied to a coil or the like can be changed by the PWM form, widely.

Thus, according to the present invention, by appropriately switching the OFF time according to the current instruction value, the linearity of the actual electric current with respect to the current instruction value is improved, and, also, energy loss in the driver can be effectively improved, and, thus, the PWM efficiency can be improved. Moreover, it is possible to effectively control the power supply ripple noise to a low level while maintaining the linearity and the high efficiency of PWM.

Further, the present invention is not limited to the above-described embodiment, and variations and modifications may be made without departing from the scope of the present invention.

The present application is based on Japanese priority application No. 2001-181918, filed on Jun. 15, 2001, the entire contents of which are hereby incorporated by reference.

What is claimed is:

1. A coil driving system which supplies a predetermined electric current to a coil by changing a pulse width of a voltage applied to said coil according to a current instruction value, said system comprising:

a current detection section which detects the electric current which flows through said coil;

a comparison section which compares a detection current value detected by said current detection section with said current instruction value;

a current control section which turns on/off the voltage applied to said coil according to a comparison result of said comparison section; and an off time control section which controls an off time for which application of the voltage to said coil is interrupted, according to the current instruction value, wherein an inductance of said coil generates a magnetic field applied to a magneto-optical disk so as to achieve information reproduction therefrom according to a super-resolution technology.

2. The coil driving system as claimed in claim 1, wherein said off time control section sets the off time such that, as the current instruction value is smaller, the off time becomes longer.

3. The coil driving system as claimed in claim 1, wherein said off time control section sets the off time such that, as the current instruction value is larger, the off time becomes shorter.

4. The coil driving system as claimed in claim 1, wherein said off time control section performs bit shift of the current instruction value so as to determine the oil time according to a value obtained from thus performed bit shift of the current instruction value.

5. The coil driving system as claimed in claim 1, further comprising an off time table in which the off time with respect to the current instruction value is stored, and wherein said off time control section determines the off time by referring to said off time table according to the current instruction value.

6. The coil driving system as claimed in claim 1, wherein said off time control section comprises:

a counter counting clock pulses according to a count value set according to the current instruction value; and a voltage application control section controlling application of the voltage to said inductance device according to a count-up output of said counter.

7. The coil driving system as claimed in claim 6, wherein said off time control section detects a timing at which the detection current value exceeds the current instruction value, and starts counting of said counter at the thus-detected timing.

8. The coil driving system as claimed in claim 6, wherein said voltage application control section comprises:

a switch section controlling application of the voltage to said inductance device from a power source; and a flywheel diode causing an electric current generated in said inductance device when said switch section turns from an on state into an off state, to flow into said power source.

9. An information storage apparatus which applies a magnetic field according to an electric current based on a current instruction value to a recording medium and performs at least one of recording/reproducing/erasing of information to/from said recording medium, comprising:

a magnetic field application section which applies tile magnetic field according to the electric current flowing therethrough to the recording medium;

a current detection section which detects the electric current which flows through said magnetic field application section;

a comparison section which compares a detection current value detected by said current detection section with said current instruction value;

a current control section which turns on/off the voltage applied to said magneto field application section according to a comparison result of said comparison section; and an off time control section which controls an off time for which application of the voltage to said magnetic field application section is interrupted, according to the current instruction value, wherein an inductance of said coil generates a magnetic field applied to a magneto-optical disk so as to achieve information reproduction therefrom according to a super-resolution technology.

10. The information storage apparatus as claimed in claim 9, wherein said off time control section sets the off time such that, as the current instruction value is smaller, the off time becomes longer.

11. The information storage apparatus as claimed in claim 9, wherein said off time control section sets the off time such that, as the current instruction value is larger, the off time becomes shorter.

12. The information storage apparatus as claimed in claim 9, wherein said off time control section performs bit shift of the current instruction value so as to determine the off time according to a value obtained from thus-performed bit shift of the current instruction value.

13. The information storage apparatus as claimed in claim 9, further comprising an off time table in which the off time with respect to the current instruction value is stored, and wherein said off time control section determines the off time by referring to said off time table according to the current instruction value.

14. The information storage apparatus as claimed in claim 9, wherein said off time control section comprises:
 a counter counting clock pulses according to a count value set according to the current instruction value; and
 a voltage application control section controlling application of the voltage to said magnetic field application section according to a count-up output of said counter.

15. The information storage apparatus as claimed in claim 14, wherein said off time control section detects a timing at which the detection current value exceeds the current instruction value, and starts counting of said counter at the thus-detected timing.

16. The information storage apparatus as claimed in claim 14, wherein said voltage application control section comprises:
 a switch section controlling application of the voltage to said magnetic field application section from a power source; and
 a flywheel diode causing the electric current generated in said magnetic field application section when said switch section turns from an on state into an off state, to flow into said power source.

17. A coil driving method by which a predetermined electric current is supplied to a coil by changing a pulse width of a voltage applied to said inductance device according to a current instruction value, comprising the steps of:
 a) detecting the electric current which flows through said coil;
 b) comparing a detection current value detected in said step a) with said current instruction value;
 c) turning on/off the voltage applied to said coil according to a comparison result in said step b); and
 d) controlling an off time for which application of the voltage to said coil is interrupted, according to the current instruction value,
 wherein an inductance of said coil generates a magnetic field applied to a magneto-optical disk so as to achieve information reproduction therefrom according to a super-resolution technology.

18. The method as claimed in claim 17, wherein, in said step d), the off time is set such that, as the current instruction value is smaller, the off time becomes longer.

19. The method as claimed in claim 17, wherein, in said step d), the off time is set such that, as the current instruction value is larger, the off time becomes shorter.

20. The method as claimed in claim 17, wherein, in said step d), bit shift of the current instruction value is performed so that the off time is determined according to a value obtained from thus-performed bit shift of the current instruction value.

* * * * *

UNITED STATES PATENT AND TRADEMARK OFFICE
CERTIFICATE OF CORRECTION

PATENT NO.   : 6,917,567 B2
DATED        : July 12, 2005
INVENTOR(S)  : Nishida et al.

It is certified that error appears in the above-identified patent and that said Letters Patent is hereby corrected as shown below:

<u>Title page, Item [54] and Column 1, line 2,</u>
Title, please delete "APPARATUS, AND" and insert -- APPARATUS AND -- therefor; and please insert -- COIL -- between "AND" and "DRIVING".

<u>Title page,</u>
Item [57], ABSTRACT,
Line 1, please insert -- a -- between "to" and "coil".

<u>Column 14,</u>
Line 3, please delete "oil" and insert -- off -- therefor.
Line 49, please delete "magneto" and insert -- magnetic -- therefor.

Signed and Sealed this

Eleventh Day of October, 2005

JON W. DUDAS
*Director of the United States Patent and Trademark Office*